United States Patent [19]

Deodhar

[11] Patent Number: 4,567,594

[45] Date of Patent: Jan. 28, 1986

[54] REED-SOLOMON ERROR DETECTING AND CORRECTING SYSTEM EMPLOYING PIPELINED PROCESSORS

[75] Inventor: Shirish P. Deodhar, Canoga Park, Calif.

[73] Assignee: Burroughs Corporation, Detroit, Mich.

[21] Appl. No.: 502,046

[22] Filed: Jun. 7, 1983

[51] Int. Cl.⁴ .............................................. G06F 11/12
[52] U.S. Cl. ..................................................... 371/38
[58] Field of Search .................. 364/200, 900; 371/38, 371/39, 40, 43, 45

[56] References Cited

U.S. PATENT DOCUMENTS

| | | | |
|---|---|---|---|
| 4,041,461 | 8/1977 | Kratz et al. | 364/200 |
| 4,162,480 | 7/1979 | Berlekamp | 364/200 |
| 4,393,502 | 7/1983 | Tanaka et al. | 371/38 |
| 4,413,339 | 11/1983 | Riggle et al. | 371/38 |

Primary Examiner—Michael R. Fleming
Attorney, Agent, or Firm—Nathan Cass; Kevin R. Peterson; Edmund M. Chung

[57] ABSTRACT

Apparatus and methods are disclosed for providing on-line error detection and correction of errors in an optical disk storage system using Reed-Solomon decoding techniques. An implementation is employed which divides the Reed-Solomon decoding process into a sequence of well defined steps requiring a minimum of inter-step parameter transfers. These steps are implemented by a plurality of processors operating in a pipelined manner.

12 Claims, 8 Drawing Figures

| INPUT DATA | S-PROCESSOR | SIGMA-PROCESSOR | X-PROCESSOR | Y-PROCESSOR | EC-PROCESSOR |
|---|---|---|---|---|---|
| SECTOR 1 (1A, 1B, 1C) | 1A<br>1B<br>1C | | | | |
| SECTOR 2 | 2A<br>2B<br>2C | 1A<br>1B<br>1C | 1A<br>1B | 1A | |
| SECTOR 3 | 3A<br>3B<br>3C | 2A<br>2B<br>2C | 1C<br>2A<br>2B | 1B<br>1C<br>2A | |
| SECTOR 4 | 4A<br>4B<br>4C | 3A<br>3B<br>3C | 2C<br>3A<br>3B | 2B<br>2C<br>3A | 1A<br>1B<br>1C |

REED-SOLOMON ERROR DETECTING AND CORRECTING SYSTEM EMPLOYING PIPELINED PROCESSORS

BACKGROUND OF THE INVENTION

The present invention relates to improved apparatus and methods for detecting and correcting data errors in a data processing system. More particularly, the present invention relates to improved apparatus and methods for detecting and correcting data errors in data having relatively high raw error rates and also containing multiple relatively long burst errors occurring randomly in the data streams such as may occur, for example, in an optical data storage system.

Conventional storage devices, such as magnetic disks, typically have a relatively low raw bit error rate of the order of $10^{-9}$. As a result, relatively simple single-short-burst error detecting and correcting methods and apparatus have been found sufficient for use with such devices for providing an effective bit error rate of typically $10^{-12}$ or lower, as conventionally required in order to provide adequate system-level performance. However, where data having a much higher raw bit error rate, such as $10^{-5}$ must be detected and corrected, these known error detecting methods and apparatus are unable to provide an effective bit error rate which is adequate for conventional system-level performance. Furthermore, where data read from an optical data storage system is involved, the additional difficulty is presented of having to deal with the presence of relatively long multiple burst-errors occurring randomly in the data stream.

Reed-Solomon codes are known to be capable of detecting and correcting multiple burst errors. Methods and apparatus for using this type of code for correcting such errors has been disclosed in the art, such as, for example, in U.S. Pat. No. 4,009,160 issued July 4, 1978 and U.S. Pat. No. 4,142,174 issued Feb. 27, 1979, and also in the book by W. W. Peterson, et al., "Error Correcting Codes", Cambridge, Mass., The MIT Press, 1972, and in the article by E. R. Berlekamp, "The Technology of Error-Correcting Codes", Proc. of the IEEE, Vol. 68, No. 5, pp. 564–593, May 1980. In addition, my Thesis "High Speed Decoding of Reed-Solomon Codes", M. S. Thesis, University of Hawaii, December 1981, presents additional implementations along with basic theoretical considerations pertinent to the use of Reed-Solomon codes for detecting and correcting data errors. The contents of these publications are hereby incorporated herein.

Although a number of theoretical approaches are known for employing Reed-Solomon codes for error detection and correction (as exemplified by the references mentioned above), implementations of such known approaches require complex and expensive hardware, particularly where it is required that error detection and correction be performed sufficiently fast so as to be on-line with the system in which it is employed.

SUMMARY OF THE INVENTION

Accordingly, it is the primary object of the present invention to provide improved methods and apparatus for implementing an error detecting and correcting system employing Reed-Solomon coding having a relatively high raw bit error rate.

An additional object of the invention is to provide for essentially on-line error detection and correction of errors in an optical disk memory so as not to affect the speed of operation thereof.

Another object of the invention is to provide for achieving the foregoing objects using a relatively simple and economical implementation.

The above objects are accomplished in a preferred embodiment of the invention which divides the Reed-Solomon decoding process into a sequence of well defined steps requiring a minimum of inter-step parameter transfers. These steps are implemented in the preferred embodiment by a plurality of processors, one for each of the defined steps, operating in a pipelined manner so as to provide efficient and fast decoding. Additional efficiency in the implementation is achieved by combining in a single processor the check byte generating function (encoding) with the partial syndrome generating step of the decoding process. Further efficiency in the implementation is also achieved by employing a common base design for a plurality of the processors.

The specific nature of the invention as well as other objects, features and advantages thereof will become apparent from the following description of a preferred embodiment taken in conjunction with the accompanying drawings.

DESCRIPTION OF A PREFERRED EMBODIMENT

Introduction

In the commonly assigned copending application Ser. No. 311,629, now U.S. Pat. No. 4,494,226, filed Oct. 15, 1981, for Three Beam Optical Memory System, inventors Robert L. Hazel and Edward W. LaBudde (now U.S. Pat. No. 4,494,226, issued Jan. 15, 1985), an optical data storage system is described in which data is stored on a rotatable optical disk in a plurality of concentric tracks. Each track is in turn divided into a plurality of sectors, each sector containing a block of data. For the purposes of the particular embodiment of the invention to be described herein, it will be assumed that 90 bytes of user data are written into each block and that the raw bit error rate obtained when the data is read is about $10^{-5}$. For such a system, the embodiment described herein is capable of providing essentially on-line detection and correction of data errors so as to achieve an effective bit error rate of about $10^{-12}$ appropriate for conventional system-level performance.

Implementation of Reed-Solomon Codes

Before describing the construction and operation of a preferred embodiment of the invention, it will be helpful to first consider how a Reed-Solomon code is preferably implemented for use in this embodiment.

Reed-Solomon codes are defined with code symbols from a Galois field of numbers represented as GF $(2^m)$, m being a positive integer. The aforementioned U.S. Pat. No. 4,142,174 and Thesis along with the book "Algebraic Coding Theory", by E. R. Berlekamp, McGraw-Hill Book Company, 1968, provide a detailed description of Galois fields. Some relevant aspects of arithmetic in Galois fields will now be presented.

The basic Galois field is GF (2) and it consists of the two elements 0, 1. The following operations are defined in GF (2):

| (1) Addition: | $0 + 0 = 0$ | $1 + 0 = 1$ |
|---|---|---|
|  | $0 + 1 = 1$ | $1 + 1 = 0$ |
| (2) Multiplication: | $0 \cdot 0 = 0$ | $1 \cdot 0 = 0$ |
|  | $0 \cdot 1 = 0$ | $1 \cdot 1 = 1$ |

Galois fields GF $(2^m)$ with m greater than 1 are called extensive fields of GF (2). Consider GF $(2^4)$ or GF (16). It is a finite field with 16 elements, and a 4-bit representation for the elements of this field can be generated as a fourth degree polynomial $p(x)=x^4+x^3+1$ which is a fourth degree polynominal that is indivisible by any polynomial of degree between 1 to 3. Note that the coefficients of polynominals are added or multiplied using arithmetic as defined above for GF (2). For example, $(x^2+x+1)+(x)=x^2+1$. In addition, the smallest degree of n for which p(x) divides exactly into $(x^n+1)$ is given by $n=(2^m-1)=2^4-1=15$ where m is the degree of p(x). Such a polynomial is called a primitive polynominal.

As an example, let b be the solution of the equation $p(x)=0$. Then $b^4+b^3+1=0$. The elements $b^0$, $b^1$, ..., $b^{14}$ in addition to the zero element 0 form the 16 elements of GF (16). $b^0$ is called the unit element and is represented as 1. Since p(x) divides exactly into $(x^{15}+1)$, $b^{15}+1=0$, that is, $b^{15}=1=b^0$.

The powers of b can also be represented in polynomial form. Thus, $b^i = c_0 \cdot b^3 + c_1 \cdot b^2 + c_2 \cdot b + c_3$ where $c_j$ is either 0 or 1. This representation is the remainder obtained upon dividing x by p(x) and then replacing x by b. The 4 bits $(c_0 c_1 c_2 c_3)$ then form a 4-bit representation of the elements of GF (16). Choosing a primitive polynomial p(x) ensures that these elements are distinct. Table I below lists the 16 elements of GF (16).

TABLE 1

| Elements of GF (16) | |
|---|---|
|  | $(C_0 C_1 C_2 C_3)$ |
| ZERO | 0000 |
| $b^0$ | 0001 |
| $b^1$ | 0010 |
| $b^2$ | 0100 |
| $b^3$ | 1000 |
| $b^4$ | 1001 |
| $b^5$ | 1011 |
| $b^6$ | 1111 |
| $b^7$ | 0111 |
| $b^8$ | 1110 |
| $b^9$ | 0101 |

TABLE 1-continued

| Elements of GF (16) | |
|---|---|
|  | $(C_0 C_1 C_2 C_3)$ |
| $b^{10}$ | 1010 |
| $b^{11}$ | 1101 |
| $b^{12}$ | 0011 |
| $b^{13}$ | 0110 |
| $b^{14}$ | 1100 |

Being a field, the elements of GF (16) satisfy the following properties:

(i) GF (16) is a commutative group under an operation defined as addition (+). Addition of two elements is a bit-wise exclusive-OR. The zero element (0) is called the additive identity of GF (16). The additive inverse of any element is the element itself; since when an element is added to itself, the result is 0.

(ii) The set of non-zero elements in GF (16) form a commutative group under an operation called multiplication (·). Two elements $b^i$, $b^j$ are multiplied as follows:

$$b^i \cdot b^j = b^{(i+j)} \text{ modulo (15)}$$

The multiplication can be performed using a 256×4 ROM (Read-Only Memory) that stores the multiplication table. Multiplication by a fixed element is simpler. Consider that a general element $b^i$ is to be multiplied by the fixed element b.

$$b^i \cdot b = (c_0 b^3 + c_1 b^2 + c_2 b + c_3) \cdot b$$
$$= c_0 \cdot b^4 + c_1 \cdot b^3 + c_2 \cdot b^2 + c_3 \cdot b$$

But
$b^4 + b^3 + 1 = 0$ by definition.
Hence,
$$b^i \cdot b = c_0(b^3 + 1) + c_1 \cdot b^3 + c_2 \cdot b^2 + c_3 \cdot b$$
$$= (c_0 + c_1)b^3 + c_2 \cdot b^2 + c_3 \cdot b + c_0.$$

Figure 1:
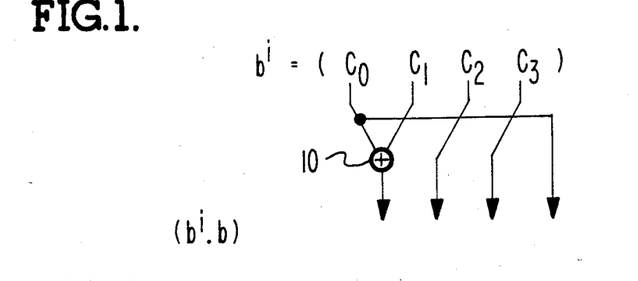
FIG. 1 is a circuit diagram illustrating the multiplication of an element in GF (16) by b using Galois field arithmetic.

The circuit shown in FIG. 1 employing the Exclusive OR circuit 10 accomplishes the above multiplication. The unity element (1) is called the multiplicative identity of GF (16) since multiplying an element by 1 leaves its value unchanged. Every non-zero element $b^i$ also has a multiplicative inverse given by $b^{(15-i)}$. This follows from the fact that $b^{15}=1$. A preprogrammed 16×4 ROM can be used as a look-up table for the inverse function.

The Galois field GF $(2^8)$=GF (256) can be constructed in a similar fashion as described above for GF (16) by using a primitive polynominal of degree 8. However, it is more advantageous to generate GF (256) as an extension field of GF (16).

The polynominal $m(x)=x^2+x+b$ is a primitive polynominal in GF (16). b is an element of GF (16). The smallest value of n for which m(x) exactly divides $x^n+1$ [using arithmetic in GF (16)] is given by $n=16^2-1=255$.

Let "a" be a solution of the equation $m(x)=0$. Then $a^2+a+b=0$. The powers of "a" namely, $a^0$, a, $a^2$, ..., $a^{254}$ along with the zero element (0) then form the 256 distinct elements of GF (256). $a^0$ is the unity element of GF (256) denoted as 1. Since m(x) divides $x^{255}+1$, $a^{255}$ equals 1.

The elements of GF (256) can also be represented in polynomial form as: $a^i = A + B \cdot a$ where A,B are elements from GF (16). This representation is the remainder obtained upon dividing $x^i$ by m(x) and then replacing x by a.

A,B being elements of GF (16) have a 4-bit representation. Concatenating the 4-tuples gives an 8-bit representation for elements in GF (256).

The two operations of addition and multiplication are also definable in GF (256). Addition is simply the bit-wise exclusive-OR of two elements. Multiplication in GF (256) can be reduced to a problem of multiplication and addition in GF (16).

Let (A+B·a) and (C+D·a) be two elements in GF (256).
Then:

$$(A+B\cdot a)\cdot(C+D\cdot a)=AC+(BC+AD)\cdot a+BD\cdot a^2$$

But $a^2=a+b$ by definition
Hence $(A+B\cdot a)\cdot(C+D\cdot a)=(AC+BD\cdot b)+(BC+AD+BD)\cdot a$.

Figure 2:
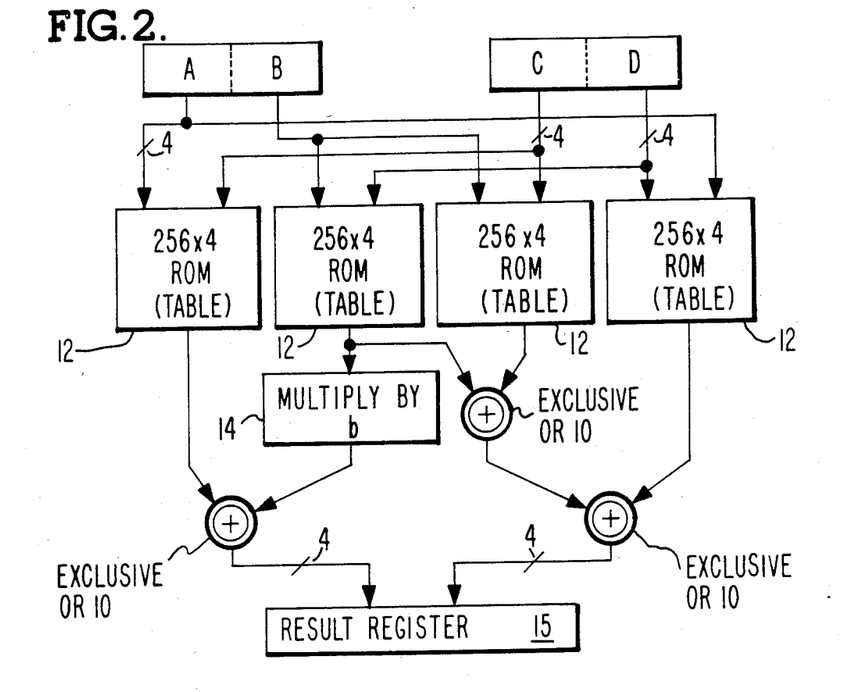
FIG. 2 is a circuit diagram illustrating a GF (256) multiplier using Galois field arithmetic.

The circuit shown in FIG. 2 is a GF (256) multiplier. The 256×4 ROMs 12 are GF (16) multiplier tables, and the multiply by b operation indicated in block 14 is done using the circuit in FIG. 1. The outputs of the ROMs 10 and the multiply by block 14 are applied to Exclusive OR circuits 10 as shown and the results stored in a result register 15.

Other operations in GF (256) pertinent to the illustrative embodiment described herein include the Inverse and Square Root of elements. The inverse of $a^i$ is simply $a^{(255-i)}$ and can be obtained by looking up a preprogrammed 256×8 ROM.

The Square Root of $a^i$ is given by:
SQUARE ROOT $(a^i) = a^{i/2}$ if $i$ even
$a^{(i+255)/2}$ is $i$ odd.

Again a 256×8 ROM can implement this function.

Reed-Solomon Code Specifications for the Preferred Embodiment

A primitive t-error correcting (n·k) Reed-Solomon (RS) code with symbols from GF $(2^m)$ has the following parameters:

Symbol size = m bits
Block length = $n = (2^m - 1)$ symbols.
Number of parity check symbols = $n - k = 2t$
Number of data symbols = $k = (2^m - 2t - 1)$.

For the preferred embodiment of the invention disclosed herein, a 4-error correcting RS code defined in GF (256) is used. Each symbol is 8 bits (one byte) wide. The primitive (255,247) parent code is shortened into a (38,30) code. This shortening is equivalent to assuming that the leading (255−38)=217 data bytes in the code word are always $\phi\phi$.

Figure 3:
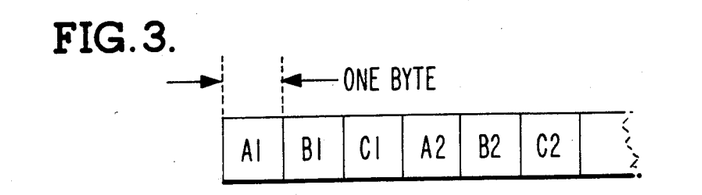
FIG. 3 is a diagram illustrating how the bytes of code words, A, B and C are recorded in an interleaved manner in a sector of an optical disk.

As mentioned previously, it will be assumed that each block of data (corresponding to a sector on an optical disk) contains 90 bytes of user data. These 90 bytes are encoded into 3 code words. Eight parity check bytes are provided per code word so that there are 24 check bytes in every sector. These 3 code words are arranged in an interleaved manner in each sector as illustrated in FIG. 3 so as to improve the burst correction capability. In this arrangement every third byte belongs to a specific code word. Thus bytes A1, A2 and A3 in FIG. 3 are the first three bytes of code word A, bytes B1, B2 and B3 are the first three bytes of code word B, and bytes C1, C2 and C3 are the first three bytes of code word C.

There are two basic functions performed by a data error detecting and correcting system. First, there is the encoding function which provides for generating parity check symbols when new data is being stored. Second, there is the decoding function which operates on the encoded data read back in order to detect errors and, if possible, correct all errors detected. The basic manner in which each of these two functions are achieved in the preferred embodiment using Reed-Solomon coding will next be considered.

Encoding

To generate the check bytes for the (38,30) code word employed in the preferred embodiment, the following generator polynomial is used:

$$g(x)=(x+1)(x+a)(x+a^2)(x+a^3)(x+a^4)(x+a^5)(x+a^6)(x+a^7)$$

where "a" is the element of GF (256) as defined in the section on Galois fields. Expanding and using GF (256) arithmetic, g(x) can be represented as:

| $g(x) = x^8 + g_7 \cdot x^7 + g_6 \cdot x^6 + g_5 \cdot x^5 + g_4 \cdot x^4 + g_3 \cdot x^3 +$ | |
|---|---|
| $g_2 \cdot x^2 + g_1 \cdot x + g_0$ | |
| Where  $g_0 = a^{28}$ | $g_1 = a^{133}$ |
|  $g_2 = a^{196}$ | $g_3 = a^{156}$ |
|  $g_4 = a^{129}$ | $g_5 = a^{149}$ |
|  $g_6 = a^{182}$ | $g_7 = a^{112}$ |

While encoding, it is useful to consider the three interleaved code words as forming a single code word obtained from the generator polynominal $G(x)=g(x^3)$. The 90 bytes of user data can be expressed in the form of a polynomial d(x). Thus:

$$d(x)=d_{89}\cdot x^{89}+d_{88}\cdot x^{88}+\ldots +d_1\cdot x+d_0$$

The data bytes $d_i$ are treated as symbols from GF (256) where $d_{89}$ is the first byte received by the encoder, and $d_0$ is the last. The 24 parity bytes are then obtained as the remainder p(x) when the polynominal $x^{24}$ d(x) is divided by G(x). Thus:

$$p(x)=p_{23}\cdot x^{23}+p_{22}\cdot x^{22}+\ldots +p_1\cdot x+p_0=\text{remainder } [x^{24}\cdot d(x)/G(x)]$$

where $p_{23}$ is the first parity byte and $p_0$ is the last. All operations during the division are performed in GF (256). The code polynomial w(x) can then be used to represent the 118 bytes of encoded data as follows:

$$w(x) = x^{24} \cdot d(x) + p(x)$$
$$= w_{113} \cdot x^{113} + w_{112} \cdot x^{112} + \ldots + w_1 \cdot x + w_0$$

w(x) has the property that it is completely divisible by G(x) and hence by all the factors of G(x) namely, $(x^3+1), (x^3+a), \ldots, (x^3+a^7)$.

Decoding

Suppose a (38,30) code polynominal c(x) corresponding to one of the three code words written on a sector of the disk is read back as a received polynominal r(x). In the absence of errors r(x) equals c(x), while errors cause r(x) to differ from c(x) by an error polynominal e(x). For the (38,30) code word being assumed:

$$e(x) = e_{37} \cdot x^{37} + e_{36} \cdot x^{36} + \ldots + e_1 \cdot x + e_0$$

= r(x) + c(x).

The error polynominal can also be described by a list of error values $y_i$ and error locations $x_i$ of its non-zero components. $x_i$ identifies which symbol (byte) is in error, while $y_i$ is the actual bit error pattern for that symbol. $x_i$ has the value $a^j$ [where $a^j$ is an element of GF (256)] when an error occurs in the $(N-j_i)$th symbol. $N(=255)$ is the length of the primitive (255,247) code which was shortened to yield the (38,30) code. Since the leading 217 bytes are always assumed to be zero, valid values of $j_i$ range only from 0 to 37.

Decoding involves determining the values of $x_i$, $y_i$. Correct decoding is possible if the number of symbol errors e is less than or equal to the code correction capability t. For the (38,30) code, t equals 4. A conventional decoding procedure, such as suggested by the aforementioned Peterson book, employs the following steps:

Step 1: Evaluation of Partial Syndromes

Partial syndromes, defined below, are calculated for each code word.

$$S_k = e(a^k) = \sum_{i=1}^{e} y_i x_i^k$$

$$= \sum_{i=1}^{e} y_i (a^k)^j$$

for $0 \leq K \leq 7$.

The $a^k$ are the roots of the generator polynominal $g(x)$. Hence:

$$c(a^k) = 0$$

From equation (1), it follows that:

$$S_k = r(a^k)$$

Thus the 8 partial syndromes can be evaluated from the received polynominal $r(x)$. If no errors are present, then all the partial syndromes $S_k$ are zero. Equation (2) for the partial syndromes $S_k$ consist of 8 equations in the 2e unknowns $x_i$, $y_i$. These equations are solvable if $e \leq 4$.

Step 2: Determining the error location polynominal

Equation (2) for the partial syndromes $S_k$ are nonlinear and cannot be solved directly. Instead, an error location polynominal $\sigma(x)$ with $X_i$ as roots is defined as follows:

$$\sigma(x) = \prod_{i=1}^{e} (x - +x_i)$$

$$= x^e + \sigma_1 \cdot x^{e-1} + \ldots + \sigma_{e-1} \cdot x^{e-1} + \sigma_e$$

where $$\sigma_1 = \sum_{i=1}^{e} x_i,\ \sigma_2 = \sum_{i \neq j} x_i \cdot x_j \text{ etc.}$$

are the so called elementary symmetric functions of $x_i$. $\sigma_i$ are related to the partial syndromes through the following Newton's identities.

$$S_u + \sigma_1 \cdot S_{u-1} + \ldots + \sigma_e \cdot S_{u-e} = 0$$

for $u = e, e+1, e+2, \ldots, 2t-1, \ldots$

The known values are $S_0, S_1, \ldots, S_{2t-1}$

The above linear equations can be solved for $\sigma_1, \sigma_2, \ldots, \sigma_e (e \leq t)$. First the maximum number of successive equations that are linearly independent are determined. This is the number of errors e that actually occurred. Then $\sigma_{e+1}$ to $\sigma_t$ are set equal to zero and the first e equations are solved for $\sigma_1, \sigma_2, \ldots, \sigma_e$. A general technique for solving these equations is described in the aforementioned Berlekamp book. However, for the preferred embodiment, a trial and error approach is used as disclosed in the aforementioned Thesis and U.S. Pat. No. 4,142,174, since it is easier to implement for small values of t. In this approach (assuming non-zero partial syndromes have been obtained), the decoder starts by assuming $e=1$. For $t=4$, Newton's identities are:

$$s_1 + \sigma_1 s_0 = 0$$

$$s_2 + \sigma_1 s_1 = 0$$

$$s_3 + \sigma_1 s_2 = 0$$

$$s_4 + \sigma_1 s_3 = 0$$

$$s_5 + \sigma_1 s_4 = 0$$

$$s_6 + \sigma_1 s_5 = 0$$

$$s_7 + \sigma_1 s_6 = 0$$

The first equation above yields $\sigma_1 = (s_1/s_0)$

It is not necessary to check if this value satisfies all the remaining identities. It is sufficient to verify that $\sigma_1$ satisfies only $(t-e)=3$ additional equations in order to be sure that the assumption of $e=1$ is correct within the bounds of detectability. The uncertainty arises from the fact that a large number of symbol errors, greater than t, may fool the decoder into making a false correction.

If the assumption of $e=1$ is incorrect, the decoder assumes $e=2$ and tries to solve for $\sigma_1$ and $\sigma_2$ that satisfy the following equations:

$$s_2 + \sigma_1 s_2 + \sigma_2 s_0 = 0$$

$$s_3 + \sigma_1 s_2 + \sigma_2 s_1 = 0$$

$$s_4 + \sigma_1 s_3 + \sigma_2 s_2 = 0$$

$$s_5 + \sigma_1 s_4 + \sigma_2 s_3 = 0$$

$$s_6 + \sigma_1 s_5 + \sigma_2 s_4 = 0$$

$$s_7 + \sigma_1 s_6 + \sigma_2 s_5 = 0$$

Figure 4:
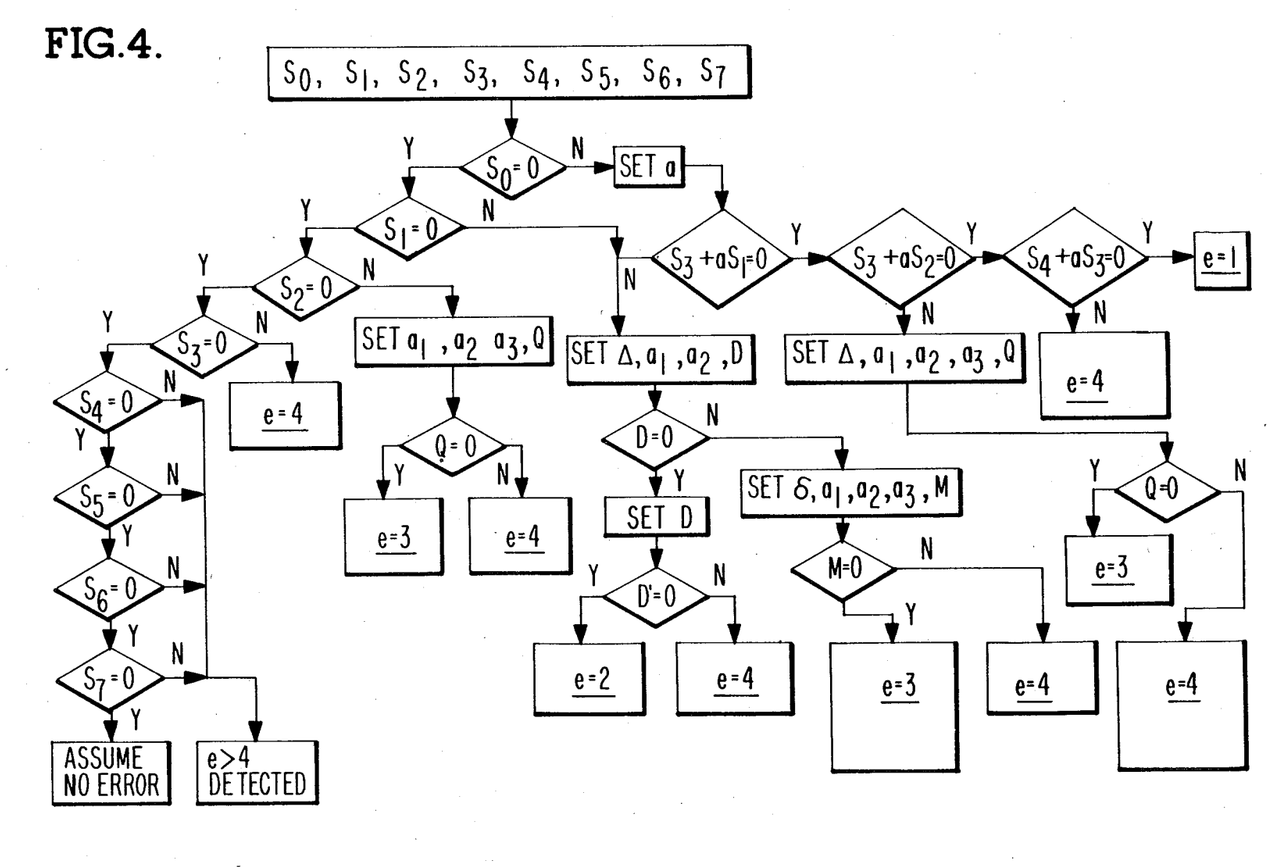
FIG. 4 is a flow chart showing how the error location polynominal $\sigma(x)$ is determined.

If this also fails, the decoder tries $e=3$ and possibly $e=4$. If even $e=4$ is unsuccessful, an uncorrectable error has been detected. A general flow chart for this process is presented in FIG. 4. The worst case path, delineated with heavy lines, requires about 40 additions and over 60 multiplications in GF (256).

Step 3: Determining error locations

The error location polynominal $\sigma(x)$ can be factorized to yield the error locations. One known method is to evaluate $\sigma(x)$ at all possible field elements of GF (256). This method is known as the Chien search and has the disadvantage that in some situations the computation time may be unacceptably high, particularly where four errors are to be corrected. Accordingly, the preferred embodiment employs a method which is generally similar to the faster method disclosed in the aforementioned U.S. Pat. No. 4,099,160. The manner in which this method is employed in the preferred embodiment will next be presented.

Consider the 4 values of e of interest.

$e = 1$ Here
$$\sigma(x) = x + \sigma_1$$

The error location is simply $x_1 = \sigma_1$. The actual error byte number is indicated by the GF (256) logarithm of $\sigma_1$.

$e = 2 \; \sigma(x) = x^2 + \sigma_1 \cdot x + \sigma_2$
where $\sigma_1 = x_1 + x_2, \sigma_2 = x_1 \cdot x_2$.

The equation can be solved as follows:
(a) Scaling: Replace x by $\sigma_1 x'$. Then $\sigma'(x) = x^2 + x + \sigma_2/\sigma_1^2$ where the primes on x have been dropped for simplicity.
(b) A look-up table in GF (256) can be generated that maps the value of $$f = \frac{\sigma_2}{\sigma_1^2} \text{ onto a root of } \sigma'(x).$$

The roots have the property that:

$$x_1' + x_2' = 1 = a^0$$

$$x_1' \cdot x_2' = f.$$

A $256 \times 8$ ROM can be programmed to generate $x_1'$ when f is input. $x_2'$ is then simply $(x_1' + 1)$.
(c) The roots of $\sigma(x)$ are obtained by multiplying those of $\sigma'(x)$ by $\sigma_1$.

$e = 3 \; \sigma(x) = x^3 + \sigma_1 \cdot x^2 + \sigma_2 \cdot x \sigma_3$ where $\sigma_1 = x_1 + x_2 + x_3$ $\sigma_2 = x_1 x_2 + x_1 x_3 + x_2 x_3$ $\sigma_3 = x_1 x_2 x_3$ The 3 roots $x_1, x_2, x_3$, can be found by the following sequence of steps:
(a) Translation: Replace x by $x' + \sigma_1$. $\sigma'(x) = x^3 + (\sigma_2 + \sigma_1^2) \cdot x + (\sigma_3 + \sigma_2 \sigma_1)$ where the primes on x have been dropped.

(b) Scaling: Replace x by $\sqrt{\sigma_2 + \sigma_1^2} \cdot U$

This gives:

$$\sigma(U) = U^3 + U + \frac{\sigma_3 + \sigma_2 \sigma_1}{(\sigma_2 + \sigma_1^2)^{3/2}}$$

(c) (U) has roots $U_1, U_2, U_3$ with the following properties:

$U_1 + U_2 + U_3 = 0$ $U_1 U_2 + U_1^2 + U_2^2 = 1$ $U_1 U_2 U_3 = h$

Two $256 \times 8$ look-up tables can be programmed to generate $U_1, U_2$ whenever h is input. $U_3$ is simply $U_1 + U_2$.

(d) $x_1, x_2, x_3$ is then obtained as:

$$x_i = U_i \cdot \sqrt{\sigma_2 + \sigma_1^2} + \sigma_1 \; i = 1,2,3.$$

$e = 4$: Here $$\sigma(x) = x^4 + \sigma_1 x^3 + \sigma_2 x^2 + \sigma_3 x + \sigma_4$$

This equation can be solved as follows:

(a) Translation: let $x = x' + \sqrt{\frac{\sigma_3}{\sigma_1}}$ $$(x) = x^4 + \sigma_1 x^3 + (\sqrt{\sigma_1 \sigma_3} + \sigma_2) x^2 + \left(\frac{\sigma_3}{\sigma_1}\right)^2 + \frac{\sigma_2 \sigma_3}{\sigma_1} + \sigma_4$$

(b) Inversion: Replace x by $\frac{1}{x}$

After dropping primes this gives.

$(x) = x^4 + b_2 x^2 + b_3 x + b_4$

Where $$b_4 = \frac{\sigma_1^2}{\sigma_3^2 + \sigma_1 \sigma_2 \sigma_3 + \sigma_1^2 \sigma_4}$$

$b_3 = \sigma_1 \cdot b_4$ $b_2 = (\sqrt{\sigma_1 \sigma_3} + \sigma_2) \cdot b_4$ (c) The polynomial in Step b is an affine polynomial; that is, its roots form an affine polynomial. Denoting these roots by y, p+r, q+r, p+q+r:

$\sigma'''(x) = (x+r)(x+p+r)(x+q+r)(x+p+q+r)$

Expanding and relating the unknown roots to known coefficients;

$b_2 = p^2 + q^2 + pq$ $b_3 = pq(p+q)$ $b_4 = r(p+r)(q+r)(p+q+r)$

Observe that:

$(x+p)(x+q)(x+p+q) = x^3 + b_2 x + b_3$

It is thus possible to solve for p, q using the algorithm derived earlier for the e=3 case.

(d) Since $\sigma'''(x)$ has no cubic term, it must factor into two gradratics of the form:

$\sigma'''(x) = (x^2 + wx + s)(x^2 + wx + t)$
Where $w^2 + s + t = b_2 \; s \cdot t = b_4$
$w(s + t) = b_3$
Let $x^2 + wx + s = (x + q + r)(x + r)$ -continued
$$= x^2 + qx + (q + r) \cdot r$$

Then w=q, where q was determined in step c.

Thus $s + t = \dfrac{b_3}{q}$ $s \cdot t = b_4$

The values of s, t can then be determined since the quadratic $$x^2 + \frac{b_3}{q} \cdot x + b_4 = (x + s)(x + t)$$

can be factored using the method for the t=2 case. Then with s, t known, the two quadratics $x^2+qx+s$ and $x^2+qx+t$ can be factored similarly to obtain the 4 roots of $\sigma''(x)$.

(e) The roots of $\sigma(x)$ can be found by reversing the inversion and translation processes performed in steps a and b.

Using the above method, the error locations may be obtained in any random order. It is convenient to arrange these error locations in ascending order.

Note that factorization of $\sigma(x)$ must yield e distinct roots. If $\sigma(x)$ cannot be factorized completely or if roots are not distinct, then the code word is assumed to be uncorrectable. This condition is detected when illegal values of f (step b for e=2 case) or h (step c for e=3 case) are detected. These illegal values are mapped onto the zero element, which is an invalid value of x. By checking for x=0 after table lookup, uncorrectable code words can be identified.

Finally, since a shortened (38,30) code word is used in the preferred embodiment, valid error locations range from $a^0$ to $a^{37}$. Checking if log $a^i$ [logarithm as defined in GF (256)] is greater than 37 can trap invalid error correction. The code word is then flagged as being uncorrectable.

Step 4: Determining Error Values

The error locations $x_i$ are substituted into the first e equations of:

$$S_k = \sum_{i=1}^{e} y_i x_i^k$$
$$(k = 0, 1, \ldots, 7)$$

The equations, which are not linear, can be solved for the e unknown $y_i$ using matrix inversion. The algorithms for the values of interest are listed below.

$e = 1 \quad y_1 = s_0$
$\quad y_2 = y_3 = y_4 = 00$ $e = 2 \quad y_1 = \dfrac{s_1 + s_0 x_2}{x_1 + x_2}$ $\quad y_2 = s_0 + y_1$
$\quad y_3 = y_4 = 00$ $e = 3 \quad y_1 = \dfrac{s_2 + s_1(x_2 + x_3) + s_0 x_2 x_3}{(x_1 + x_2)(x_1 + x_2)}$ $\quad y_2 = \dfrac{(s_0 x_3 + s_1) + Y_1(x_1 + x_3)}{x_2 + x_3}$ $\quad y_3 = s_0 + y_1 + y_2$ -continued
$y_4 = \phi\phi$ $e = 4 \quad y_1 =$ $\dfrac{s_3 + s_2(x_2 + x_3 + x_4) + s_1(x_2 x_3 + x_3 x_4 + x_2 x_4) + s_0 x_2 x_3 x_4}{(x_1 + x_2)(x_1 + x_3)(x_1 + x_4)}$ $y_2 = \dfrac{y_1(x_1 + x_3)(x_1 + x_4) + s_2 + s_1(x_3 + x_4) + s_0 x_3 x_4}{(x_2 + x_3)(x_2 + x_4)}$ $y_3 = \dfrac{y_1(x_1 + x_4) + y_2(x_2 + x_4) + (s_0 x_4 + s_1)}{(x_3 + x_4)}$ $y_4 = s_0 + y_1 + y_2 + y_3$ Step 5: Error Correction If the previous decoding steps have indicated a correctable code word, the e values of $x_i$, $y_i$ can be used to perform error correction. To the byte pointed to by LOG $x_i$, the value of $y_i$ is added to give the corrected value. This error correction can be done as the bytes are being shifted out of the decoder, if LOG $x_i$ are arranged sequentially.

When interleaved code words are used (as in the preferred embodiment), values of $x_i$, $y_i$ for all the interleaves are accumulated before online error correction, as described above, is performed.

Figure 5:
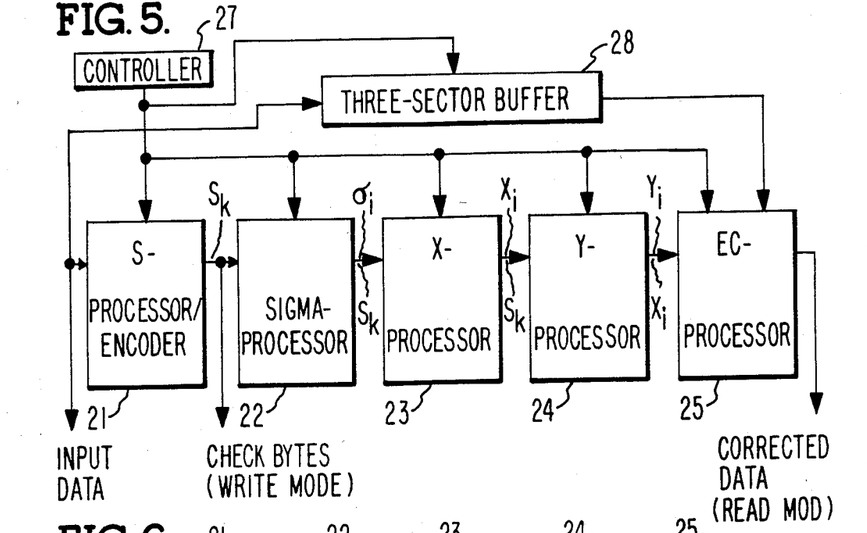
FIG. 5 is a block diagram illustrating a preferred embodiment of an error detecting and correcting system in accordance with the invention.

Overall Structural Implementation (FIG. 5)

As will be evident from the foregoing description, the decoding process is divided into a sequence of five well-defined steps. At each step the specific calculations to be made have been set forth. Of particular importance is the fact that inter-step parameter transfers are minimal. The preferred embodiment takes advantage of this fact to provide a fast, relatively simple and economic implementation which employs a pipelined architecture that combines five processors for respectively performing the five steps of the decoding process. A block diagram is shown in FIG. 5.

With reference to FIG. 5, the five special purpose processors are shown and designated as an S-Processor/Encoder 21, a Sigma-Processor 22, an X-Processor 23, a Y-Processor 24 and an EC-Processor 25. Under the overall control of a controller 27, each of these processors performs a respective one of the five steps of the above described decoding process whereby errors are detected and corrected in the data read from each sector of an optical disk. As described previously in connection with FIG. 3, each sector contains three interleaved code words, wherein each code word contains 30 user bytes and 8 check bytes.

Since reading and writing occur at different times, it has been found advantageous to also include the encoding function in the first processor 21. Accordingly, the S-Processor/Encoder 21 also provides for the on-line generation of the 24 (8 per code word) check bits per sector 81 which are written in the same sector of the optical disk following the 90-bytes of user data (30 bytes per code word). For generation of the check bytes, the three interleaved code words are treated as a single code word, thereby simplifying the encoder design.

Figure 6:
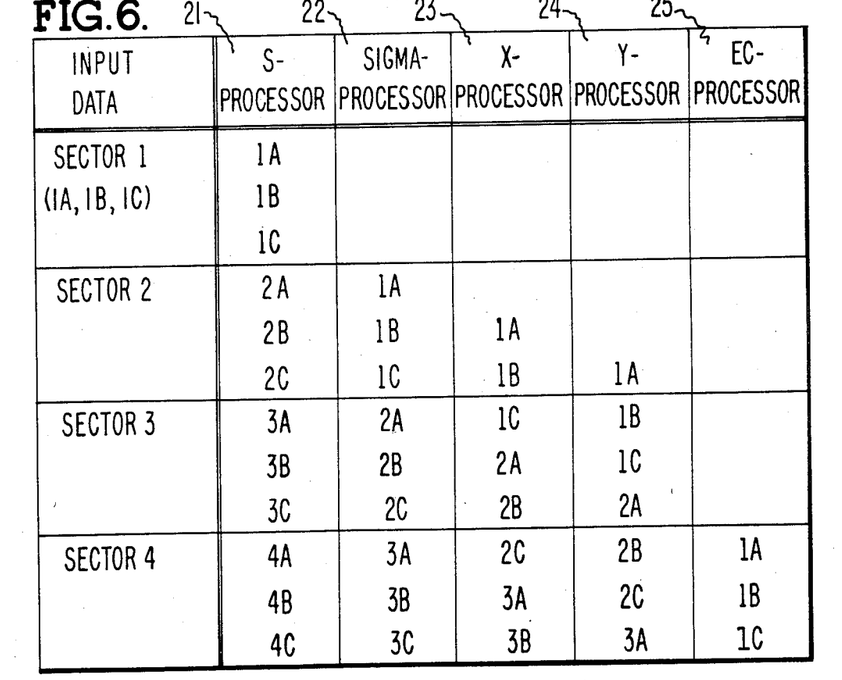
FIG. 6 is a chart illustrating the flow of code words through the processors of FIG. 5.

During the reading of the optical disk, uncorrected bytes read from the optical disk are serially applied to the S-Processor/Encoder 21 and also to the 3-sector buffer 28. In order to operate in real-time, the decoding operations of the processors 21–25 in FIG. 5 must maintain a rate of decoding of the 3 code words (comprising a sector) in one sector time. FIG. 6 illustrates the flow of the illustrative code words A, B and C through the decoder. The numbers preceding A, B and C indicate the sector to which each corresponds. The decoding sequence, which employs the five steps described previously, is as follows:

(1) The S-Processor/Encoder 21 (when operating in the read mode) determines the 24 partial syndromes $S_k$ for the entire sector (3 code words). Due to interleaving, the entire sector must be received before syndromes for any code word is ready.

(2) Before the beginning of the next sector, the Sigma-Processor 22 reads in these syndromes $S_k$. Then, for each code word:

(a) The Sigma-Processor 22 determines the number of byte errors e, and the error location polynomial sigma (X).

(b) The X-Processor 23 factorizes sigma (X) to get the error locations $x_i$.

(c) The Y-Processor 24 calculates the error values $y_i$ at each error location.

(3) The Y-Processor 24 accumulates $x_i$, $y_i$ for one sector and then transfers it to the EC-Processor for error correction.

(4) The EC-Processor 25 corrects an entire sector as it is being read out from the buffer. As illustrated in FIG. 6, each processor in the pipeline processes 3 code words in one sector time. From FIG. 6, it is also evident that there is a fixed decoding delay of 3 sectors, which is ordinarily negligible when compared to the access time of the disk.

A more detailed description of the processors 21-25 illustrated in FIG. 5 will next be presented.

Figure 7:
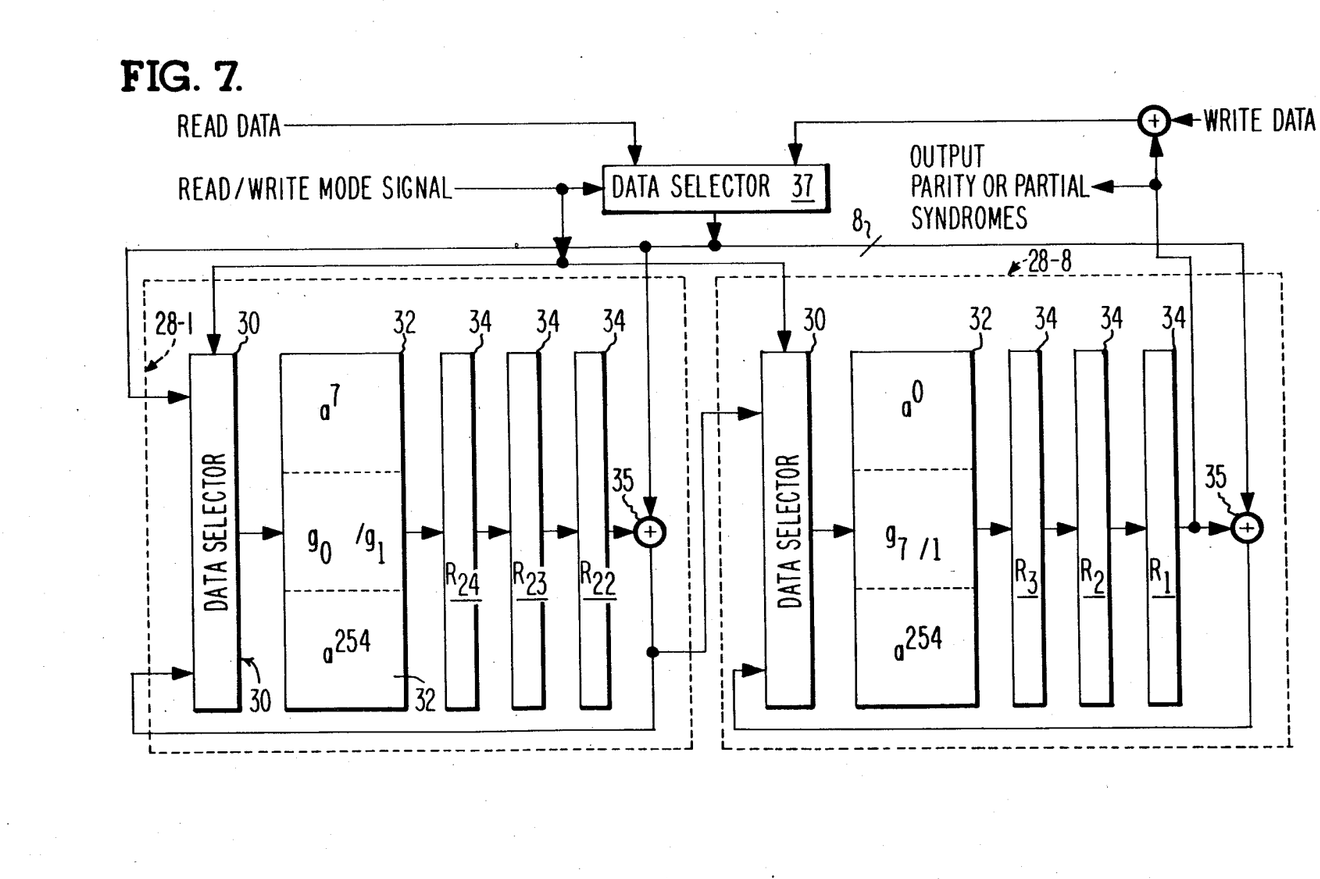
FIG. 7 is a block diagram illustrating a preferred embodiment of the S-Processor/Encoder of FIG. 5.

S-Processor/Encoder 21 (FIG. 7)

While there are a number of known ways for providing the encoding and partial syndrome generation functions of the S-Processor/Encoder 21, the particular embodiment shown in FIG. 7 is preferred. FIG. 7 comprises 8 like sections 28-1 to 28-8 (one for each of the eight check bytes), only the first and last of these sections being shown. Each section 28 includes a data selector 30, a ROM 32, three registers 34, and an adder 35. The three registers 34 are provided in each section to accommodate the 3-way interleaving shown in FIG. 3. Each of the ROMs 32 is divided into three parts. One part is programmed to provide appropriate g coefficients for generating the required 24 check bytes (8 per code word) during encoding using the Reed-Solomon encoding method previously described herein. The second part of each ROM 32 is programmed to provide the $a^k$ multipliers required for generating transforms of the 24 partial syndromes (8 per code word) using the Step 1 method previously described herein. The third part of each ROM 32 provides for multiplication by $a^{254}$ which converts these transforms to partial syndromes.

The S-Processor/Encoder also includes an additional data selector 37 to which the write data (user data) and read data are applied. A READ/WRITE MODE signal applied to data selectors 30 and 37 (from the controller 27 in FIG. 5) causes the appropriate g coefficients in the ROMs 32 to be accessed during writing and the appropriate $a^k$ multipliers in the ROMs to be accessed during reading, as required in accordance with the respective encoding and decoding methods previously described herein.

During encoding, the twenty-four registers 34 (three-per-section and one-per-check byte) are cleared at the beginning of each sector and then the 90 bytes of user data to be recorded in the sector are serially applied to each section. After the last byte of user data has been received, the registers 34 will contain the 24 check bytes. These 24 check bytes are then shifted to the output for writing in the respective sector following the user data. The clocking required for this shifting has not been shown in order to simplify the figure, but can readily be provided in a conventional manner.

During decoding, the 114 bytes (90 user bytes and 24 check bytes) read from a sector of the disk are serially applied to each section of the S-Processor/Encoder 21. Transforms of the partial syndromes will be stored in the registers 34 after the last byte of the sector is received. These transforms of partial syndromes are then shifted out to the Sigma-Processor 22 (FIG. 7) before the next sector bytes are received. During this shifting, the $a^{254}$ multiplier parts of the ROMs 32 are employed to convert these transforms into valid partial syndromes at the output.

Figure 8:
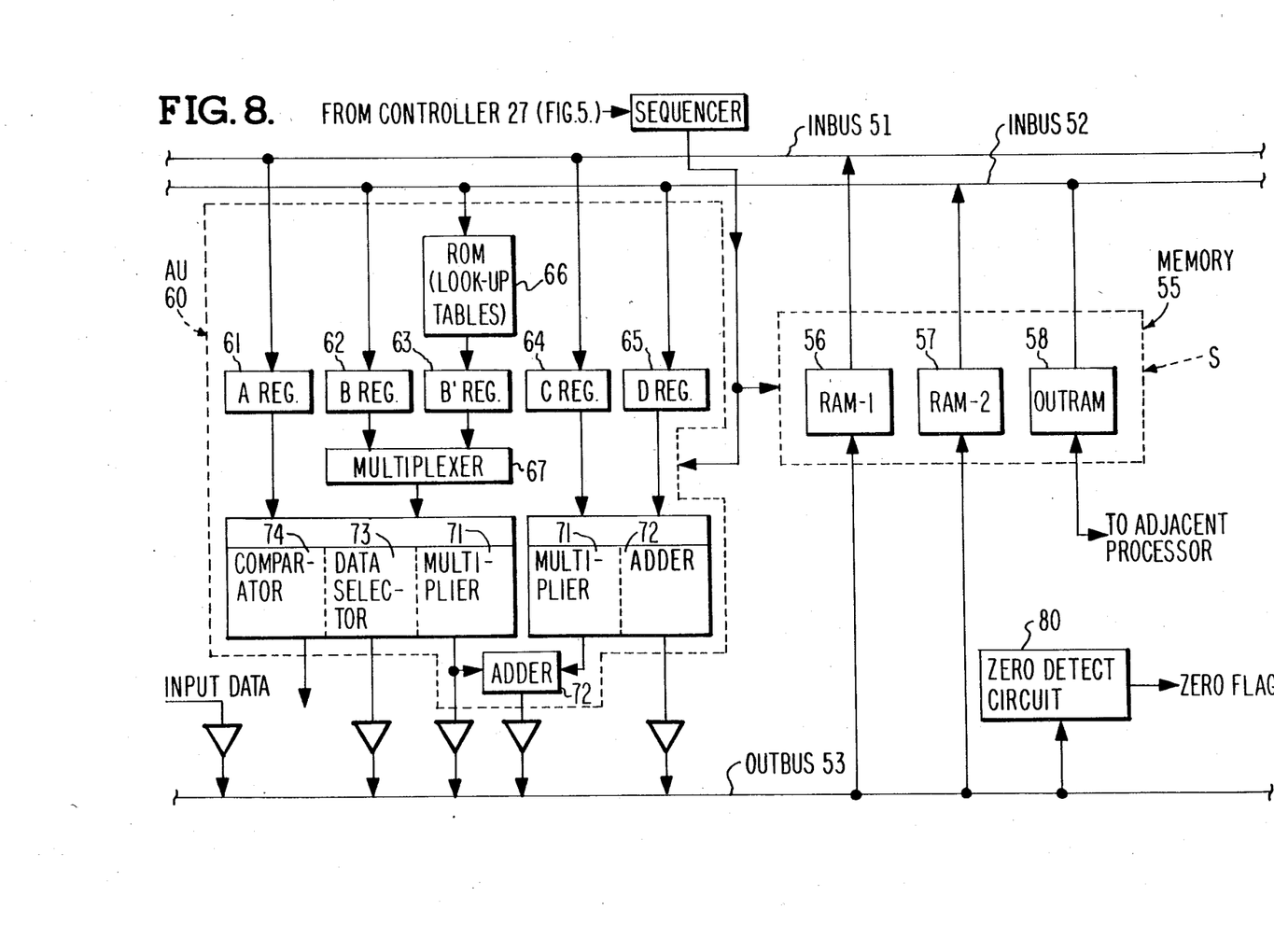
FIG. 8 is a block diagram illustrating a preferred embodiment of a data processor which can be used for each of the sigma X and Y processors in FIG. 5.

Sigma-Processor 22, X-Processor 23 and Y-Processor 24 (FIG. 8)

As mentioned previously, the Sigma-Processor 22, the X-Processor 23 and the Y-Processor 24 are provided to perform the functions required for the previously described steps 2, 3 and 4, respectively, of the decoding process. While it is within the present skill of the art to provide appropriately programmed processors for performing the functions required by these steps, a more advantageous approach is employed in the preferred embodiment of the invention whereby the same basic processor is used for each of the processors 22, 23 and 24. FIG. 8 illustrates the design of this basic processor.

As shown in FIG. 8, a triple-bus design is employed for the illustrated processor comprised of two input buses 51 and 52 and one output bus 53. This triple-bus design provides for simultaneously fetching two operands from a memory 55 for application to an arithmetic unit 60 via input buses 51 and 52. The result produced by the arithmetic unit 60 is fed back to the memory 55 via the output bus 53 for storage in either of two RAMs (random access memories) 56 or 57 provided in the memory 55. A zero detect circuit 80 coupled to the output bus 53 provides a zero flag output signal which indicates whether the result is zero.

The arithmetic unit contains five registers 61-65 designated A, B, B', C and D, a ROM 66 containing lookup tables, and a multiplexer 67. Only one of the B or B' registers 62 and 63 are enabled in an instruction cycle as determined by the multiplexer 67. The value in register B' is equal to f(B) where B is the value in register B, and f can be the inverse, square root, logarithm or some other mapping function in GF (256), as required by the previously described decoding method being performed.

As shown in FIG. 8, the arithmetic unit 60 additionally includes multipliers 71, adders 72, a data selector 73 and a comparator 7. The multipliers 71 are the GF (256) multipliers shown in FIG. 2, while the adders 72 are Exclusive OR circuits. The arithmetic unit 60 is thus able to perform the following operations in carrying out the method required for its particular decoding step, as described previously:

(1) Addition: $y = C + D$ (2) Multiplication: $y=A \cdot BB'$
BB' indicates that either B or B' can be used. If $B'=1/B$, then this corresponds to dividing A by B.
(3) Expression Evaluation: $y=A \cdot BB' + C \cdot D$
(4) Table look-up: $y=B'=f(B)$
(5) Store: $y=A$, $y=B$
(6) Compare: Is $A > BB'$?
(7) Exchange: This operation is used to sort error locations.

After a code word has been processed by the processor of FIG. 10, the results are stored in the output RAM 58 of memory 55. The next following processor in the pipeline then reads out the results in the output RAM 58 and directly stores them into its own RAMs 56 and 57 via output bus 53.

Sequencing for the processor of FIG. 10 is provided by a sequencer 90 which may be of conventional form, such as a microprocessor programmed in a conventional manner to provide appropriate control and timing signals for the various components of the processor in order to perform its respective decoding operations, as described previously. Each sequencer 90 is in turn responsive to the controller 27 (FIG. 5) for coordinating its operations with that of the other processors.

EC-Processor 25

As mentioned previously, the EC-Processor 25 serves to correct the bytes of an entire sector as it is being read out from the 3-sector buffer 28 in FIG. 5. It will be evident from FIG. 6 that the 3-sector buffer 28 appropriately delays the sector bytes so that they are input to the EC-Processor 25 at the same time that the decoded results of the operations on these same sector bytes are transferred to the input of the EC-Processor 25 from the Y-Processor 24. Correction of errors in the sector bytes is then provided as previously described for step 5 of the decoding process, which can be accomplished in a conventional manner, such as disclosed in the aforementioned patents.

Although this specification has been primarily directed to a particular preferred embodiment, it is to be understood that many modifications and variations are possible without departing from the spirit of the invention.

Accordingly, the present invention is to be considered as including all possible modifications and variations encompassed within the scope of the invention as defined in the appended claims.

I claim:
1. In a disk storage system, a machine implemented method for providing error detection and correction of digital data read from said disk, said method comprising:
providing a disk having a track wherein the track is in turn divided into a plurality of sectors and wherein data is recorded in each sector as a plurality of interleaved code words along with check data having values determined in accordance with Reed-Solomon decoding principles;
sequentially reading sectors of data from said disk; and
detecting and correcting errors in sectors of data read from said disk by consecutively performing a sequence of processing steps chosen in accordance with said Reed-Solomon decoding principles, wherein each step is performed by a separate processor, and wherein these processors perform said steps in a pipelined manner with respect to sequentially read sectors and at a rate which provides essentially real-time correction of data errors in sectors read from said disk.

2. The invention in accordance with claim 1, wherein said sequence of processing steps include:
determining partial syndromes for each of the code words in a sector of data read from said disk;
determining an error location polynomial for each code word using its corresponding partial syndromes;
determining error locations for each code word using its corresponding error location polynomial;
determining error values for each code word using its corresponding error locations and partial syndromes; and
correcting errors in each code using its corresponding error locations and error values.

3. The invention in accordance with claim 2, wherein said machine implemented method is performed in a manner such that the code words of a sector read from said disk are decoded over a plurality of consecutive time periods, wherein the step of determining partial syndromes is such that during a first time period partial syndromes are determined for all of the code words of the sector, wherein the step of determining an error location polynomial is such that during a next following second time period error location polynomials are determined for all of the code words of the sector, wherein the step of determining error locations is such that during a next following third time period error locations are determined for at least one of the code words of the sector and during a next following fourth time period error locations are determined for any remaining code words of the sector whose error locations were not determined during said third time period, wherein the step of determining error values is such that during said fourth time period error values are determined for those code words of the sector whose error locations were determined during said third time period and during a next following fifth time period error locations are determined for any code words of the sector whose error values were not determined during said fourth time period, and wherein the step of correcting errors is such that during said fifth time period any errors in the code words of the sector are corrected using the respective error locations and error values determining during said third, fourth and fifth time periods.

4. The invention in accordance with claim 3, wherein the aforementioned steps performed for the code words of a single sector are performed in a pipelined manner by said processors for code words read in response to said sequentially reading of sectors such that the code words of a new sector are corrected during every one of said time periods, each of said time periods being no greater than the time required for reading one sector from said disk.

5. In a disk storage system, the combination comprising:
a disk having data recorded in a track, said track being divided into a plurality of sectors, said data being recorded in each sector as a plurality of interleaved code words along with check data having values determined in accordance with Reed-Solomon decoding principles;
means for sequentially reading sectors of data from said disk; and processing means to which sectors of data read from said disk are sequentially applied, said processing means being operative to detect and correct errors in sectors of data read from said disk by performing a plurality of consecutive processing operations thereon in accordance with said Reed-Solomon decoding principles;

said processing means comprising a plurality of processors, one for each of said consecutive processing operations, said processors operating in a pipelined manner and at a rate with respect to sequentially read sectors so as to provide for essentially real-time correction of data errors in sectors read from said disk.

6. The invention in accordance with claim 5, wherein said plurality of processors includes:

a first processor to which sectors read from said disk are sequentially applied for determining partial syndromes for each of the code words in a sector of data applied thereto;

a second processor for determining an error location polynomial for each code word using its corresponding partial syndromes determined by said first processor;

a third processor for determining error locations for each code word using its corresponding error locations determined by said third processor and partial syndromes determined by said first processor; and a fifth processor for correcting errors in each code word using its corresponding error locations determined by said third processor and error values determined by said fourth processor.

7. The invention in accordance with claim 6, wherein said processing means also includes a buffer for temporarily storing sectors of data applied to said processing means, and means for applying a sector of data to said fifth processor from said buffer at a time appropriate for use thereby in correcting errors in the code words of a sector.

8. The invention in accordance with claim 5, wherein said processing means operates over successive time periods, wherein said processing means includes a buffer for temporarily storing sectors of data applied to said processing means, and wherein said plurality of processors includes:

a first processor operative during each time period for receiving a new sector of data read from said disk and responsive thereto for producing partial syndrome signals representative of the partial syndromes of all of the code words of the corresponding sector;

a second processor operative during each time period and responsive to partial syndrome signals produced by said first processor one time period earlier for producing error location polynomial signals representative of the error location polynomial of the code words of the corresponding sector;

a third processor operative during each time period and responsive to error location polynomial signals produced by said second processor one time period earlier for producing error location signals representative of the locations of data errors in at least one of the code words of the corresponding sector;

said third processor also being operative during each time period in response to error location signals produced by said second processor two time periods earlier for producing error location signals corresponding to the locations of data errors for those code words of the corresponding sector for which error location signals were not produced by said third processor in the preceding time period;

a fourth processor operative during each time period and responsive to error location signals produced by said third processor one time period earlier for producing error value signals representative of the error values in at least one of the code words of the corresponding sector;

said fourth processor also being operative during each time period in response to error location signals produced by said third processor two time periods earlier for producing error value signals representative of code words of the corresponding sector for which error value signals were not produced by said fourth processor in the preceding time period; and a fifth processor operative during each time period for receiving a different sector of data from said buffer and for correcting errors in the code words of a different sector in response to corresponding error location signals and error value signals produced by said third and foruth processors during previous time periods.

9. The invention in accordance with claim 8, wherein said predetermined later time proved by said buffer is sufficient to permit completion of the production by said third and fourth processors of the corresponding error location signals and error value signals by the time that the buffer applies the corresponding sector to said fifth processor.

10. The invention in accordance with claim 8, wherein each time period is no greater than the time required for reading one sector from said disk.

11. The invention in accordance with claim 8, wherein the same basic processor is employed for each of the second, third and fourth processors.

12. The invention in accordance with claim 8, wherein at least said second and third processors each includes an output memory for storing the results produced by its respective processor, and wherein at least each of said third and fourth processors includes an input memory and means for accessing the output memory of the preceding processor for transferring the results stored therein to its respective input memory.

* * * * *

UNITED STATES PATENT AND TRADEMARK OFFICE
CERTIFICATE OF CORRECTION

PATENT NO. : 4,567,594
DATED : January 28, 1986
INVENTOR(S) : Shirish P. Deodhar It is certified that error appears in the above-identified patent and that said Letters Patent is hereby corrected as shown below:

Col. 5, line 35, change "is" to --if--.

Col. 6, line 42, change "$x^{24}19d(x)$" to --$x^{24}.d(x)$--.

Col. 7, line 54, change "$\sigma(x) = \prod_{i=1}^{e} (x - + x_i)$" to $$-- \sigma(x) = \prod_{i=1}^{e} (x + x_i) --.$$

Col. 9, line 69, change "$U_1 U_2 + U_1^2 + U_2 = 1$" to $$--U_1 U_2 + U_1^2 + U_2^2 = 1--.$$

Col. 10, line 63, change "gradratics" to --quadratics--.

Col. 11, line 50, change "not" to --now--.

Col. 16, line 47, change "determining" to --determined--.

Signed and Sealed this

Fifth Day of August 1986

[SEAL]

Attest:

DONALD J. QUIGG

Attesting Officer

Commissioner of Patents and Trademarks